(12) United States Patent
Lee (10) Patent No.: US 7,649,202 B2
(45) Date of Patent: Jan. 19, 2010

(54) TRANSISTOR, METHOD OF FABRICATING THE SAME, AND LIGHT EMITTING DISPLAY COMPRISING THE SAME

(75) Inventor: Keun-Soo Lee, Kyunggi-do (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 529 days.

(21) Appl. No.: 11/110,962

(22) Filed: Apr. 21, 2005

(65) Prior Publication Data

US 2005/0287750 A1 Dec. 29, 2005

(30) Foreign Application Priority Data

Jun. 25, 2004 (KR) .................... 10-2004-0048321

(51) Int. Cl.
*H01L 31/00* (2006.01)
(52) U.S. Cl. ................. 257/59; 257/E51.005; 438/149
(58) Field of Classification Search .................. 257/59, 257/E51.005; 438/149; 349/48
See application file for complete search history.

(56) References Cited

U.S. PATENT DOCUMENTS

| | | | |
|---|---|---|---|
| 4,930,874 A * | 6/1990 | Mitsumune et al. ........... 349/48 |
| 6,115,128 A | 9/2000 | Vann | |
| 6,137,566 A | 10/2000 | Leonard et al. | |
| 6,166,396 A * | 12/2000 | Yamazaki .................... 257/59 |
| 6,181,412 B1 | 1/2001 | Popescu et al. | |
| 6,241,675 B1 | 6/2001 | Smith et al. | |

(Continued)

FOREIGN PATENT DOCUMENTS

CN 1381899 4/2002

(Continued)

OTHER PUBLICATIONS

Chinese Office action corresponding to Chinese Patent Application No. 2005100810090, issued on Jan. 27, 2007.

(Continued)

*Primary Examiner*—Matthew E Warren
*Assistant Examiner*—John Lin
(74) *Attorney, Agent, or Firm*—Robert E. Bushnell, Esq.

(57) ABSTRACT

A light emitting display comprises: at least one first metal layer; a second metal layer crossing the first metal layer and having a first width; a light emitting device formed adjacent to a region where the first metal layer and the second metal layer cross each other; and a pixel circuit including at least one transistor which causes the light emitting device to emit light. The transistor comprises a semiconductor layer having a second width greater than the first width. With this configuration, in the light emitting display of the present invention, the semiconductor layer of the transistor is formed in a region where the source/drain metal layer and the gate metal layer cross each other, and has a width greater than that of the source/drain metal layer, so that the source/drain metal layer is disposed within the width of the semiconductor layer. Thus, a tip of the gate metal layer, formed in the grain and the pattern edge of the semiconductor layer, is not disposed within the region overlapping the source/drain metal layer so that generation of static electricity between the gate metal layer and the source/drain metal layer is prevented.

11 Claims, 9 Drawing Sheets

U.S. PATENT DOCUMENTS

| | | |
|---|---|---|
| 6,281,878 B1 | 8/2001 | Montellese |
| 6,310,682 B1 | 10/2001 | Gavish et al. |
| 6,323,942 B1 | 11/2001 | Bamji |
| 6,448,572 B1 | 9/2002 | Tennant et al. |
| 6,456,368 B2 | 9/2002 | Seo |
| 6,512,838 B1 | 1/2003 | Rafii et al. |
| 6,515,740 B2 | 2/2003 | Bamji et al. |
| 6,522,395 B1 | 2/2003 | Bamji et al. |
| 6,580,496 B2 | 6/2003 | Bamji et al. |
| 6,587,186 B2 | 7/2003 | Bamji et al. |
| 6,614,422 B1 | 9/2003 | Rafii et al. |
| 6,635,857 B1 | 10/2003 | Kindt |
| 6,674,895 B2 | 1/2004 | Rafii et al. |
| 6,678,039 B2 | 1/2004 | Charbon |
| 6,690,354 B2 | 2/2004 | Sze |
| 6,710,770 B2 | 3/2004 | Tomasi et al. |
| 2003/0117560 A1 | 6/2003 | Yang et al. |
| 2003/0211719 A1 | 11/2003 | Ohayashi et al. |

FOREIGN PATENT DOCUMENTS

| | | |
|---|---|---|
| CN | 1380700 | 11/2002 |
| JP | 63-7666 | 1/1988 |
| JP | 07-181518 | 7/1995 |
| JP | 2001-166334 | 6/2001 |
| JP | 2001-264802 | 9/2001 |
| JP | 2001-267581 | 9/2001 |
| JP | 2001-296553 | 10/2001 |
| JP | 2002-198377 | 7/2002 |
| JP | 2003-229578 | 8/2003 |
| JP | 2003-262885 | 9/2003 |
| JP | 2004-101615 | 4/2004 |
| JP | 2004-133240 | 4/2004 |

OTHER PUBLICATIONS

*Patent Gazette* from the Chinese Patent Office issued in Applicant's corresponding Chinese Patent Application No. 2005-10081009.0 dated Feb. 6, 2008.

Japanese Office action corresponding to Japanese Patent Application No. 2005-130261, issued on Sep. 4, 2007.

\* cited by examiner

TRANSISTOR, METHOD OF FABRICATING THE SAME, AND LIGHT EMITTING DISPLAY COMPRISING THE SAME

CLAIM OF PRIORITY

This application makes reference to, incorporates the same herein, and claims all benefits accruing under 35 U.S.C. § 119 from an application entitled TRANSISTOR AND FABRICATION METHOD THEREOF AND LIGHT EMITTING DISPLAY filed with the Korean Intellectual Property Office on 25 Jun. 2004, and there duly assigned Serial No. 2004-48321.

BACKGROUND OF THE INVENTION

1. Technical Field

The present invention relates to a transistor, a method of fabricating the same and, a light emitting display comprising the same and, more particularly, to a transistor preventing static electricity between metal layers thereof, a method of fabricating the same, and a light emitting display comprising the same.

2. Related Art

Recently, various flat panel displays have been developed, and they are substitutes for cathode ray tube (CRT) displays because the CRT displays are relatively heavy and bulky. The flat panel display can be a liquid crystal display (LCD), a field emission display (FED), a plasma display panel (PDP), a light emitting display (LED), or the like.

Among flat panel displays, the light emitting display can emit light for itself by electron-hole recombination, allowing a fluorescent layer thereof to emit the light. Light emitting displays are classified into inorganic light emitting displays comprising an inorganic emitting layer, and organic light emitting displays comprising an organic emitting layer. The organic light emitting display is called an electroluminescent display.

Such a light emitting display has the advantage of fast response time similar to the CRT display, but is contrasted with a passive light emitting device, such as the LCD, which requires a separate light source.

SUMMARY OF THE INVENTION

Accordingly, it is an aspect of the present invention to provide a transistor which prevents static electricity between metal layers thereof, a method of fabricating the same, and a light emitting display comprising the same.

The forgoing and/or other aspects of the present invention are achieved by providing a light emitting display comprising: at least one first metal layer; a second metal layer crossing the first metal layer and having a first width; a light emitting device formed adjacent to a region wherein the first metal layer and the second metal layer cross each other; and a pixel circuit which includes at least one transistor which causes the light emitting device to emit light. The transistor comprises a semiconductor layer having a second width wider than the first width.

According to an aspect of the invention, the first metal layer has a width which is kept uniform in a region which overlaps the semiconductor layer.

According to another aspect of the invention, the transistor further comprises: a first insulating layer formed on the semiconductor layer; a gate metal layer formed on the first insulating layer; a second insulating layer formed on the gate metal layer; and a source/drain metal layer formed on the second insulating layer.

According to further aspects of the invention, the first metal layer includes the gate metal layer, and the second metal layer includes the source/drain metal layer.

According to an additional aspect of the invention, the pixel circuit comprises: a driving transistor connected between a power line, which is formed from the first metal layer and the light emitting device; a first capacitor having a first terminal connected to a first node, and a second terminal connected to a gate terminal of the driving transistor; a first transistor controlled by a first scan signal applied to a first scan line formed from the first metal layer, and connected between a data line formed from the second metal layer and the first node; a second transistor controlled by a second scan signal applied to a second scan line formed from the first metal layer, and connected between the first node and the power line; a third transistor controlled by the second scan signal, and connected between the gate of the driving transistor and the second node connected to the output terminal of the driving transistor; a fourth transistor controlled by the second scan signal, and connected between the second node and an anode electrode of the light emitting device; and a second capacitor connected between the first node and the power line.

According to another aspect of the invention, the fourth transistor and the third transistor are different from each other in the arrangement of N and P type materials.

Another aspect of the present invention is achieved by providing a transistor which comprises: a semiconductor layer formed on a substrate and having a first width; a first insulating layer formed to cover the semiconductor layer; a gate metal layer formed on the first insulating layer and overlapping the semiconductor layer; a second insulating layer formed to cover the gate metal layer; and a source/drain metal layer formed on the second insulating layer, having a second width narrower than the first width, and overlapping the semiconductor layer within the first width.

According to a further aspect of the invention, the gate metal layer has a width which is kept uniform in a region overlapping the semiconductor layer.

Still other aspects of the present invention are achieved by providing a method of fabricating a transistor, the method comprising the steps of: forming a semiconductor layer having a first width on a substrate; forming a first insulating layer to cover the semiconductor layer; forming a gate metal layer on the first insulating layer so as to overlap the semiconductor layer; forming a second insulating layer to cover the gate metal layer; and forming a source/drain metal layer having a second width narrower than the first width on the second insulating layer, and overlapping the semiconductor layer within the first width.

According to an aspect of the invention, the gate metal layer has its width kept uniform in a region overlapping the semiconductor layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
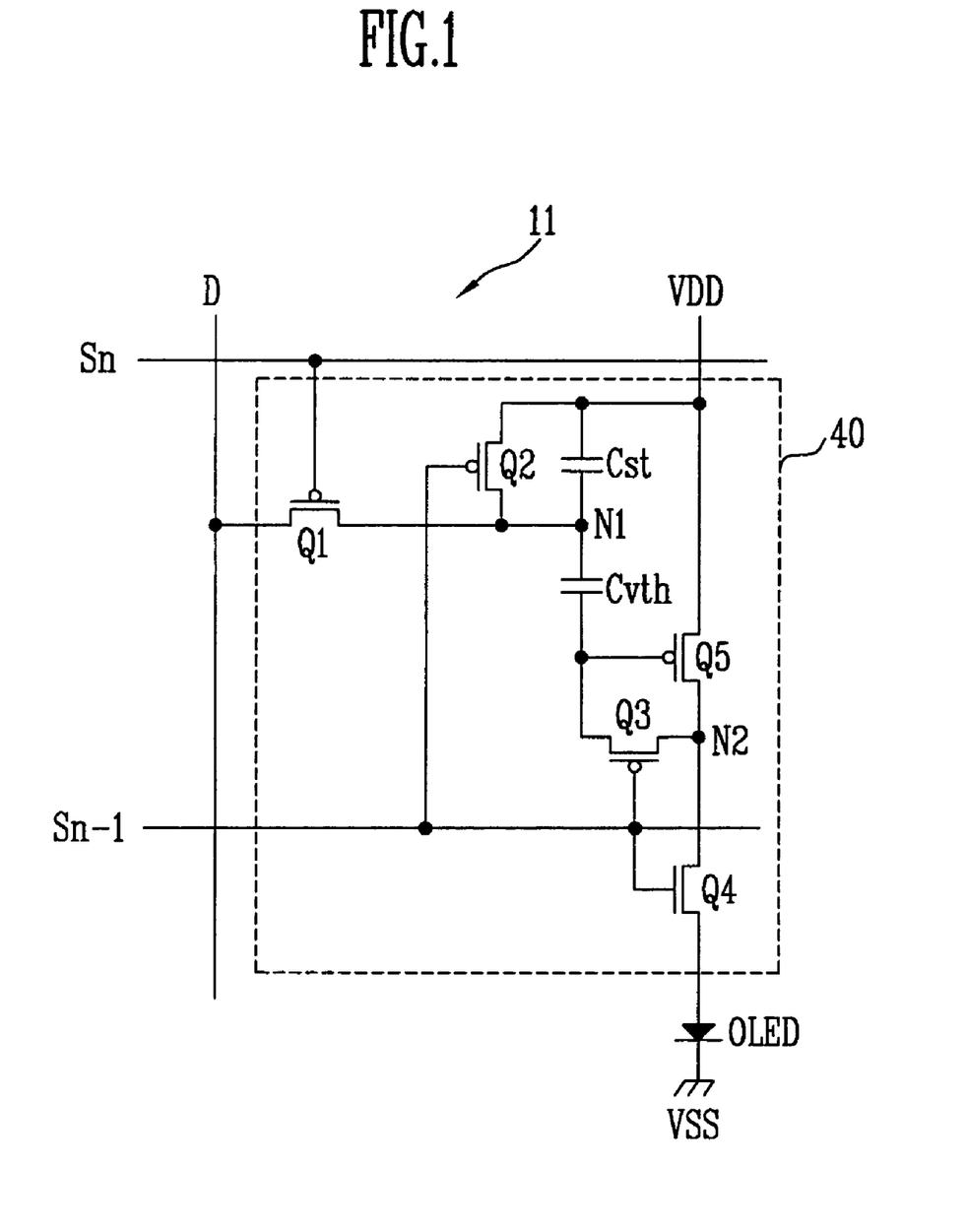
FIG. 1 is a circuit diagram of a pixel in a light emitting display.

FIG. 1 is a circuit diagram of a pixel in a light emitting display.

Referring to FIG. 1, in the light emitting display, a pixel 11 is selected when a scan signal is applied to a scan line S, and the pixel 11 emits light corresponding to a data signal applied to a data line D.

Each pixel 11 is placed where the data line D and the scan line S cross each other. Pixel 11 comprises an organic light emitting device (OLED) disposed between a first power source VDD and a second power source VSS lower than the first power source VDD, with a pixel circuit 40 being connected to both the data line D and the scan line S and driving the OLED to emit the light.

The OLED has an anode electrode connected to the pixel circuit 40, and a cathode electrode connected to the second power source VSS. Furthermore, the OLED comprises an emitting layer, an electron transport layer, and a hole transport layer, which are interposed between the anode electrode and the cathode electrode. Additionally, the OLED may comprise an electron injection layer, and a hole-injection layer. In the OLED, when power is applied between the anode electrode and the cathode electrode, electrons generated by the cathode electrode are moved to the emitting layer via the electron injection layer and the electron transport layer, and holes generated by the anode electrode are moved to the emitting layer via the hole injection layer and the hole transport layer. Then, the electrons from the electron transport layer and the holes from the hole transport layer are recombined in the emitting layer, thereby emitting light.

The pixel circuit 40 comprises: a driving transistor Q5 connected between the first power source VDD and the OLED; a first transistor Q1 connected to the $N^{th}$ scan line Sn (where N is a positive integer) and the data line D; a second transistor Q2 connected to the first transistor Q1, the first power source VDD, and the $(N-1)^{th}$ scan line Sn-1; a third transistor Q3 connected to the $(N-1)^{th}$ scan line Sn-1, and connected between a gate electrode and a drain electrode of the driving transistor Q5; a fourth transistor Q4 connected to the $(N-1)^{th}$ scan line Sn-1, and connected between the drain electrode of the driving transistor Q5 and the anode electrode of the OLED; a storage capacitor Cst connected between the first power source VDD and a first node N1 connected to the respective drain electrodes of the first transistor Q1 and second transistor Q2; and a compensation capacitor Cvth connected between the first node N1 and the gate electrode of the driving transistor Q5. In the latter regard, the first, second, third and driving transistors Q1, Q2, Q3 and Q5, respectively, are P-type transistors, and the fourth transistor Q4 is an N-type transistor.

The first transistor Q1 has its gate electrode connected to the $N^{th}$ scan line Sn, its source electrode connected to the data line D, and its drain electrode connected to the first node N1. The first transistor Q1 transmits the data signal from the data line D to the first Node N1 in response to the scan signal applied to the $N^{th}$ scan line Sn.

The second transistor Q2 has its gate electrode connected to the $(N-1)^{th}$ scan line Sn-1, its source electrode connected to the first power source VDD, and its drain electrode connected to the second node N2. The second transistor Q2 transmits voltage from the first power source VDD to the first node N1 in response to the scan signal applied to the $(N-1)^{th}$ scan line Sn-1.

The third transistor Q3 has its gate electrode connected to the $(N-1)^{th}$ scan line Sn-1, its source electrode connected to the gate electrode of the driving transistor Q5, and its drain electrode connected to the second node N2 which is connected to an output terminal of the driving transistor Q5. The third transistor Q3 connects the gate electrode of the driving transistor Q5 to the second node N2 in response to the scan signal applied to the $(N-1)^{th}$ scan line Sn-1, thereby allowing the driving transistor Q5 to be used as a diode.

The storage capacitor Cst stores voltage corresponding to the data signal applied to the first node N1 via the first transistor Q1 while the scan signal is applied to the $N^{th}$ scan line Sn, and keeps the driving transistor Q5 turned on for one frame when the first transistor Q1 is turned off.

The compensation capacitor Cvth stores voltage corresponding to a threshold voltage of the driving transistor Q5 on the basis of the first power source VDD while the scan signal is applied to the $(N-1)^{th}$ scan line Sn-1. That is, the compensation capacitor Cvth stores a compensation voltage for compensating the threshold voltage of the driving transistor Q5 while the second and third transistors Q2 and Q3, respectively, are turned on.

The driving transistor Q5 has its gate electrode connected to both the source electrode of the third transistor Q3 and the compensation capacitor Cvth, its source electrode connected to the first power source VDD, and its drain electrode connected to the source electrode of the fourth transistor Q4. The driving transistor Q5 adjusts current transmitted from the first power source VDD and applied between its source and drain electrodes according to the voltage supplied to its gate electrode, and supplies the adjusted current to the fourth transistor Q4.

The fourth transistor Q4 has its gate electrode connected to the $(N-1)^{th}$ scan line Sn-1, its source electrode connected to the second node N2, and its drain electrode connected to the anode electrode of the OLED. The fourth transistor Q4 supplies the current from the driving transistor Q5 to the OLED in correspondence to the scan signal of high level applied to the $(N-1)^{th}$ scan line Sn-1, thereby making the OLED emit light. Furthermore, the fourth transistor Q4 cuts off current passing between the driving transistor Q5 and the OLED while a scan signal of low level is applied to the $(N-1)^{th}$ scan line Sn-1.

With the latter configuration, the pixel 11 operates as follows.

Figure 2:
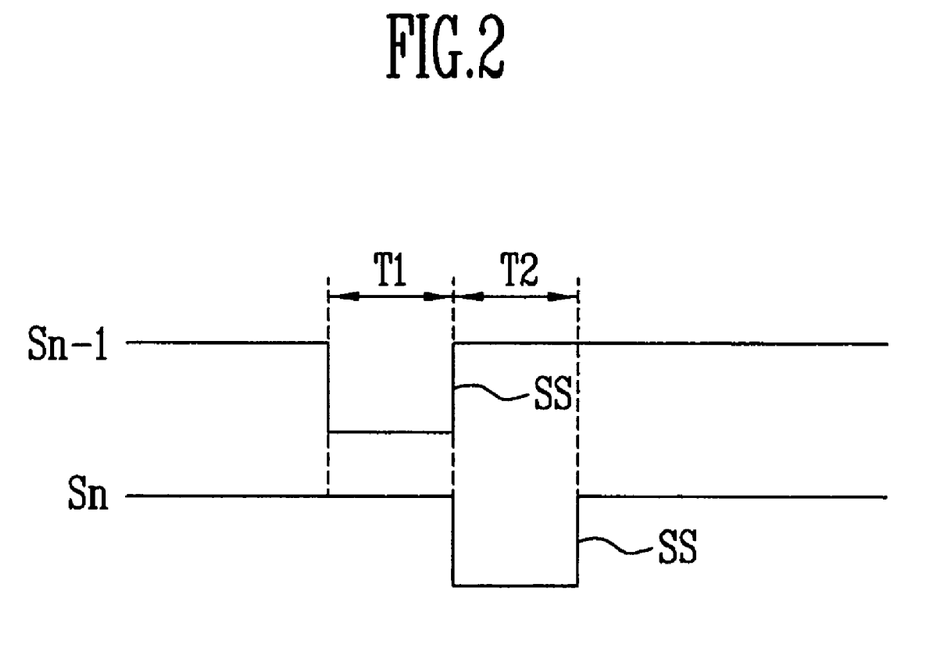
FIG. 2 is a waveform of signals for operating a light emitting device of a light emitting display.
Figure 3:
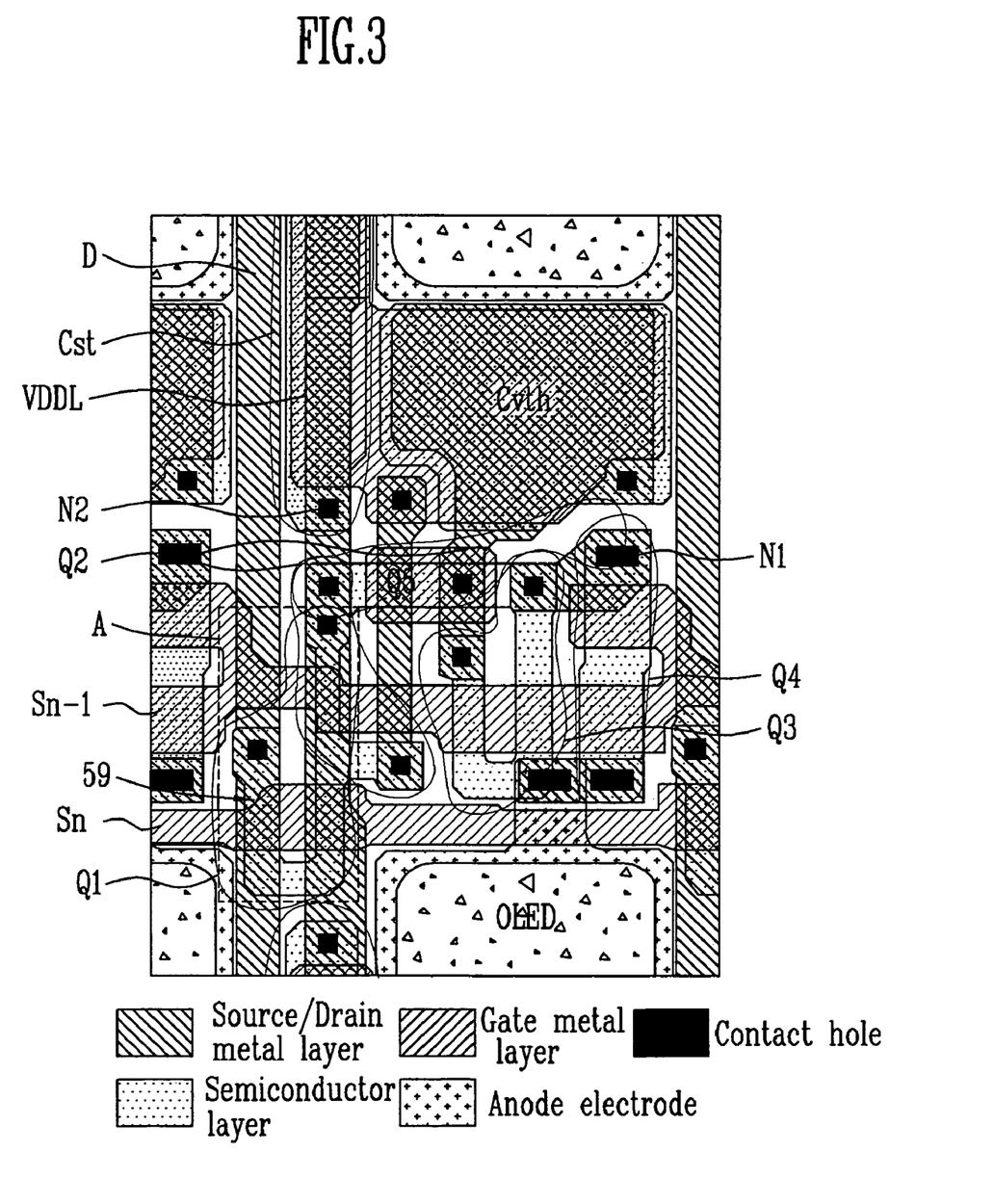
FIG. 3 is a plan view of the pixel of a light emitting display.

FIG. 2 is a waveform of signals for operating a light emitting device of a light emitting display, and FIG. 3 is a plan view of the pixel of a light emitting display.

As shown in FIG. 2, for a period T1 in which the low and high scan signals SS are applied to the $(N-1)^{th}$ scan line Sn-1 and the $N^{th}$ scan line Sn, respectively, the second transistor Q2 and third transistor Q3 are turned on, and the first transistor Q1 is turned off. In this period, the fourth transistor Q4 is turned off by the low scan signals applied to the $(N-1)^{th}$ scan line Sn-1. Because the third transistor Q3 is turned on, the driving transistor Q5 functions as a diode, and the voltage between the gate and source electrodes of the driving transistor Q5 reaches the threshold voltage Vth. Furthermore, the compensation capacitor Cvth stores a compensation voltage corresponding to the threshold voltage of the driving transistor Q5.

Then, for a period T2 in which the high and low scan signals SS are applied to the $(N-1)^{th}$ scan line Sn-1 and the $N^{th}$ scan line Sn, respectively, the second transistor Q2 and third transistor Q3 are turned off, and the first transistor Q1 is turned on. At this point, the data signal is transmitted from the data line D to the first node N1 via the first transistor Q1. Therefore, the sum of the voltage difference Vdata-VDD at the first node N1 and the compensation voltage stored in the compensation capacitor Cvth is supplied to the gate electrode of the driving transistor Q5. In this regard, the storage capacitor Cst stores the voltage difference at the first node N1 therein. Hence, the voltage Vgs applied between the gate and source electrodes of the driving transistor Q5 for the period T2 is calculated by the following the following equation 1:

$$Vgs=Vth+Vdata-VDD \quad \text{[Equation 1]}$$

where VDD is the supplied voltage, Vdata is the data signal, and Vth is the threshold voltage of a driving thin film transistor (TFT).

Furthermore, for the period T2, the fourth transistor Q4 is turned on by the high scan signal SS applied to the $(N-1)^{th}$ scan line Sn-1. At this point, the driving transistor Q5 is turned on by the sum of the voltage differences at the first node N1 and the compensation voltage stored in the compensation capacitor Cvth, and transmits current corresponding to a compensated data signal to the fourth transistor Q4. Thus, the OLED emits light due to the current supplied by the driving transistor Q5 via the fourth transistor Q4, thereby displaying a picture.

After the period T2 in which the high scan signal SS is applied to the $N^{th}$ scan line Sn, the voltage corresponding to the data signal stored in the storage capacitor Cst keeps the driving transistor Q5 turned on so that the OLED emits light for one frame, thereby displaying the picture.

Such a light emitting display includes the compensation capacitor Cvth and the second and third transistors Q2 and Q3, respectively, in order to compensate for the threshold voltage Vth of the driving transistor Q5 even though the respective pixels 11 are different in the threshold voltage Vth applied to the driving transistors Q5 thereof, so that the currents flowing into the respective OLEDs are equalized, thereby keeping the brightness of the pixels 11 uniform according to their positions.

Generally, in a light emitting display, the brightness of the pixels 11 is not uniform because of threshold voltage deviation between the transistors generated due to a non-uniform manufacturing process, particularly, because of the deviation between the threshold voltages Vth of the driving transistors Q5. Therefore, as described above, the respective pixels 11 of the light emitting display include the compensation capacitor Cvth and the second, third and fourth transistors Q2, Q3 and Q4, respectively, in order to compensate for the threshold voltage Vth of the driving transistor Q5. However, in the case where every pixel 11 comprises five transistors Q1, Q2, Q3, Q4 and Q5, and two capacitors Cvth and Cst, there arises a problem in that the aperture ratio is decreased.

Accordingly, in the light emitting display, the scan line Sn, the data line D, the first power line VDDL, and the source/drain electrodes of each transistor Q1, Q2, Q3, Q4, Q5, partially overlap each other as shown in FIG. 3 so as to form the pixel 11, thereby increasing the aperture ratio of each pixel 11. However, this overlapping structure of the signal lines increases the aperture ratio, but it causes static electricity to be generated in the overlapping region of the signal lines.

Figure 4:
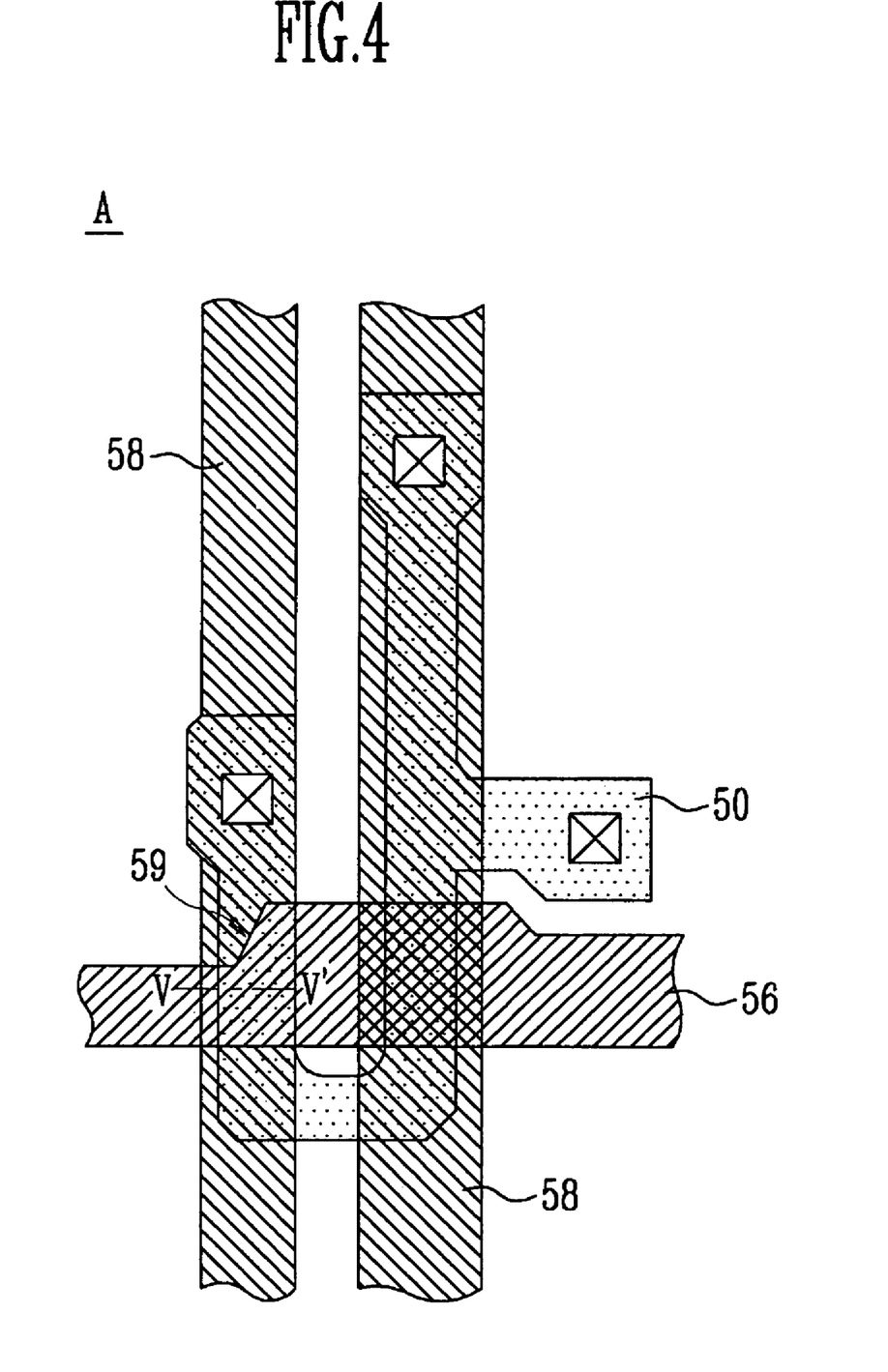
FIG. 4 is an enlarged plan view of "A" in FIG. 3.
Figure 5:
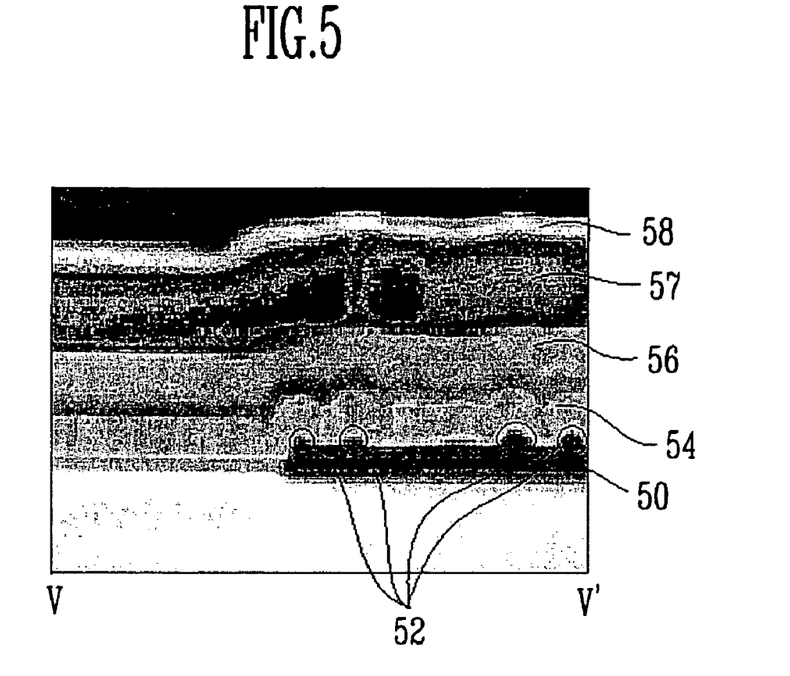
FIG. 5 is a scanning electron microscopy (SEM) photograph of a cross-sectional view taken along line V-V' in FIG. 4.
Figure 6:
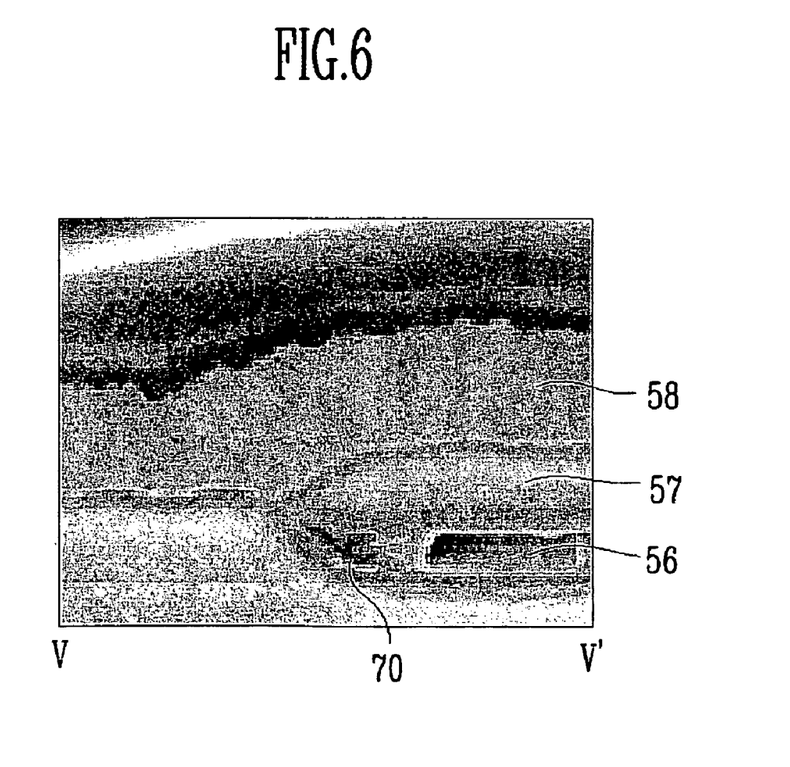
FIG. 6 is an SEM photograph of a gate insulating layer having a break due to static electricity between a semiconductor layer and a gate metal layer.

FIG. 4 is an enlarged plan view of "A" in FIG. 3, FIG. 5 is a scanning electron microscopy (SEM) photograph of a cross-sectional view taken along line V-V' in FIG. 4, and FIG. 6 is an SEM photograph of a gate insulating layer having a break due to static electricity between a semiconductor layer and a gate metal layer.

Referring to FIGS. 4 and 5, in the case where a semiconductor layer 50 of the transistor is made of polysilicon, the polysilicon is not uniformly formed at the grain boundary, so that a tip 52 is created on the surface thereof, and as a result an edge taper is not uniformly formed while being etched. Therefore, a gate insulating layer 54 and a gate metal layer 56 are not uniformly formed on the semiconductor layer 50. Particularly, the tip 52 formed at an edge portion, due to the grain boundary, of the semiconductor layer 50 causes the gate metal layer 56 to have a tip. Furthermore, in each pixel of the light emitting display, a first metal layer 56 is formed with a banding portion 59 at a region overlapping the semiconductor layer 50. That is, the first metal layer 56 has an irregular line width at the region overlapping the semiconductor layer 50. Thus, in the case where the edge portion of the semiconductor layer 50 overlaps the source/drain metal layers 58, the tip 52 of the semiconductor layer 50 causes the gate metal layer 56 to have a tip so that the current is concentrated at the edge portion of the gate metal layer 56, thereby generating static electricity between the source/drain electrodes 58. Consequently, in the light emitting display, static electricity is generated between the gate metal layer 56 and the source/drain metal layer 58 so that an insulating layer 57, interposed between the gate metal layer 56 and the source/drain metal layer 58, is broken as shown in FIG. 6.

Hereinafter, preferable embodiments of the present invention will be described in detail with reference to the accompanying drawings. The preferred embodiments of the present invention are provided in such a manner as to be readily understood by those skilled in the art, so that various modifications will be apparent, and the present invention is thus not limited to the embodiments disclosed herein.

Figure 7:
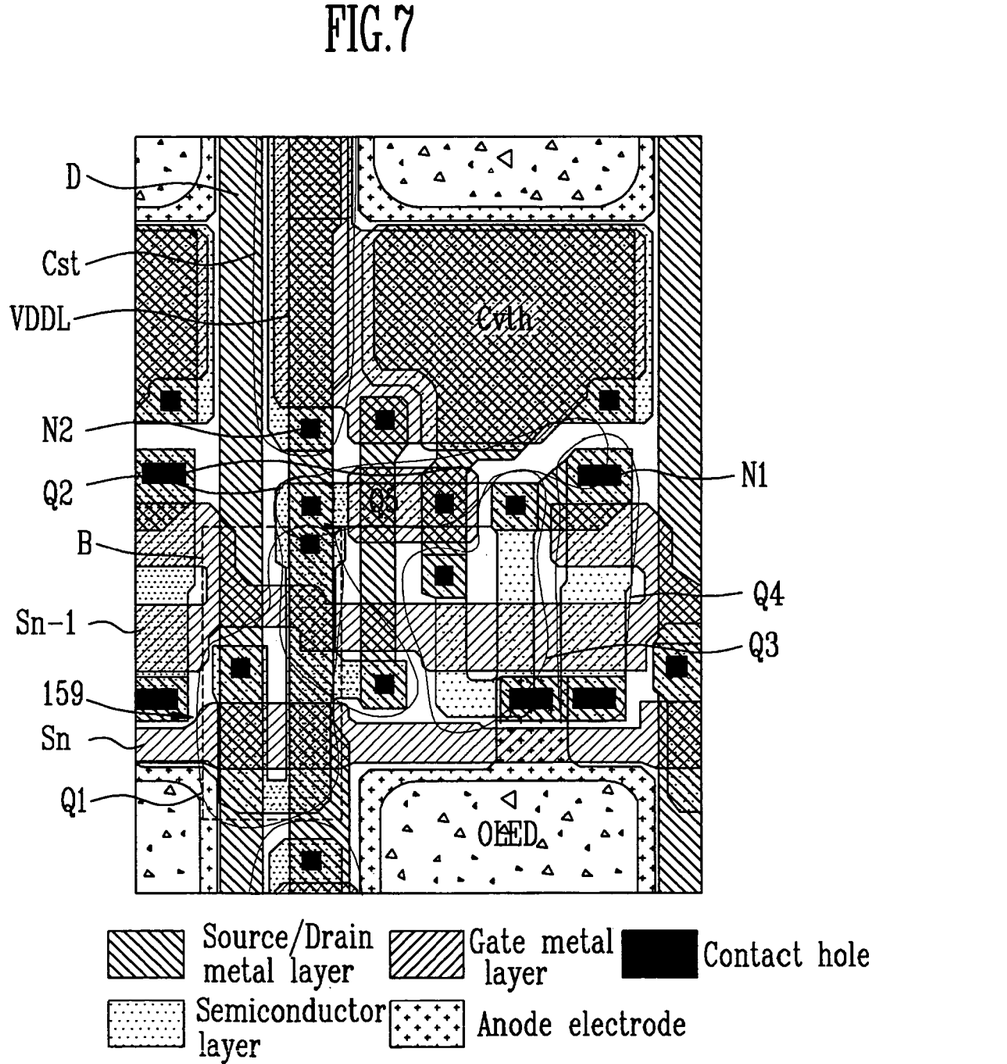
FIG. 7 is a plan view of a pixel of a light emitting display according to an embodiment of the present invention.
Figure 8:
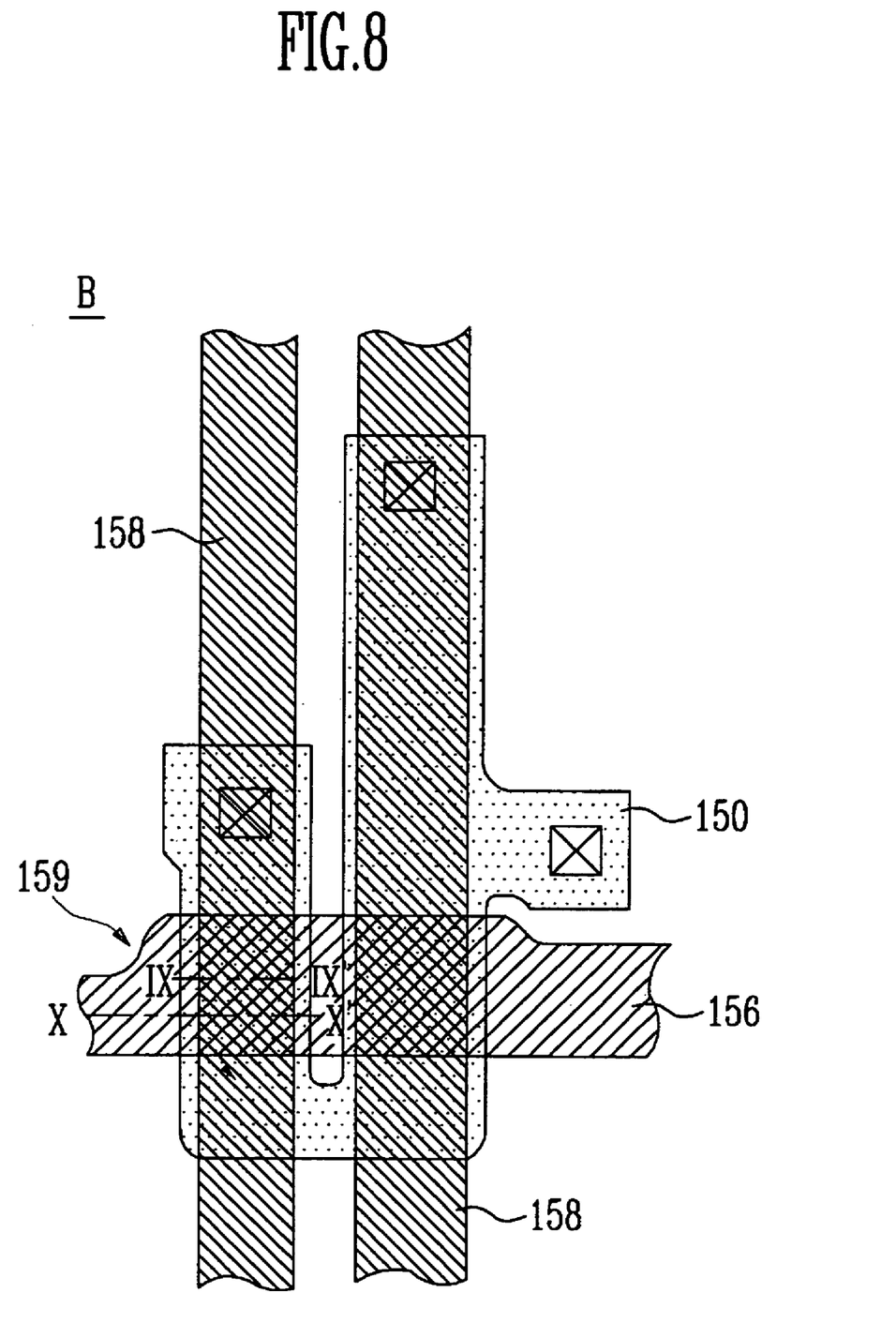
FIG. 8 is an enlarged plan view of "B" in FIG. 7.
Figure 9:
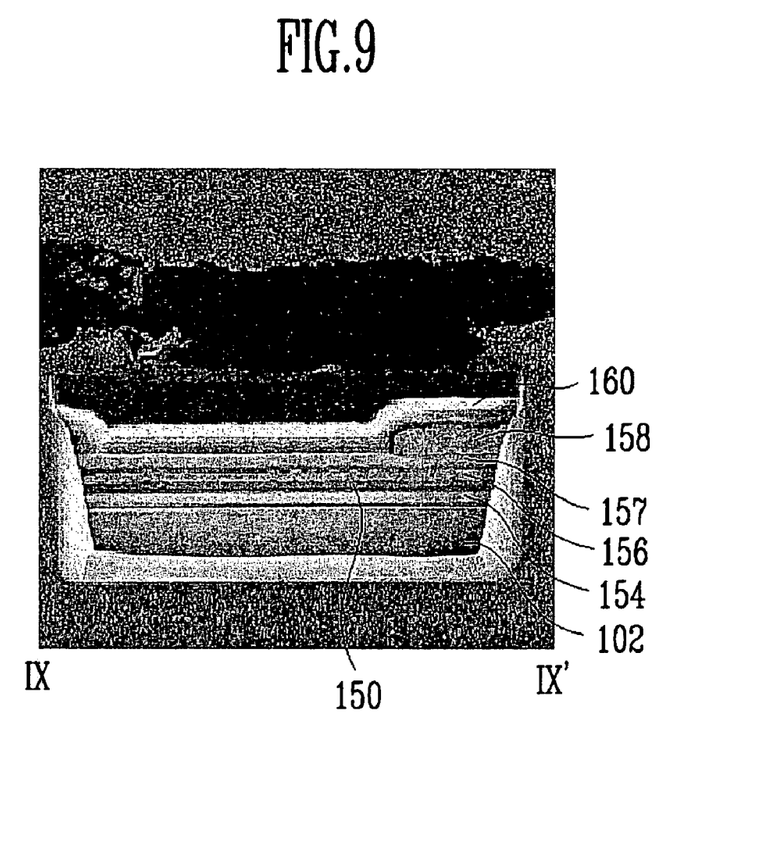
FIG. 9 is an SEM photograph of a cross-sectional view taken along line IX-IX' in FIG. 8.

FIG. 7 is a plan view of a pixel of a light emitting display according to an embodiment of the present invention, FIG. 8 is an enlarged plan view of "B" in FIG. 7, and FIG. 9 is an SEM photograph of a cross-sectional view taken along line IX-IX' in FIG. 8.

Referring to FIGS. 7 and 8, a light emitting display according to an embodiment of the present invention comprises: an OLED; a first transistor Q1 connected to an $N^{th}$ scan line Sn formed from a first metal layer, and connected to a data line D formed from a second metal layer; a driving transistor Q5 connected between a power line VDDL formed from the second metal layer and the OLED; a second transistor Q2 connected to the first transistor Q1, to the power line VDDL formed from the second metal layer, and to an $(N-1)^{th}$ scan line Sn-1; a third transistor Q3 connected to the $(N-1)^{th}$ scan line Sn-1, and connected between gate and drain electrodes of the driving transistor Q5; a fourth transistor Q4 connected to the $(N-1)^{th}$ scan line Sn-1, to the drain electrode of the driving transistor Q5, and to an anode electrode of the OLED; a storage capacitor Cst connected between the power line VDDL and a first node N1 connected to drain electrodes of the first and second transistors Q1 and Q2; and a compensation capacitor Cvth connected between the first node N1 and the gate electrode of the driving transistor Q5. In the latter regard, the first, second, third and driving transistors Q1, Q2, Q3 and Q5, respectively, are P-type transistors, and the fourth transistor Q4 is an N-type transistor.

In the light-emitting device according to an embodiment of the present invention, each of the transistors Q1, Q2, Q3, Q4 and Q5 comprises a semiconductor layer 150 having a width greater than that of the second metal layer. The first metal layer is made of the same material as the gate electrode of each transistor, and the second metal layer is made of the same material as the source/drain electrodes of each transistor.

The first transistor Q1 comprises a gate electrode connected to the $N^{th}$ scan line Sn, a source electrode connected to the data line D via a contact hole, and a drain electrode connected to the first node N1 via the contact hole. The first transistor Q1 transmits a data signal from the data line D to the first Node N1 in response to a scan signal applied to the $N^{th}$ scan line Sn.

The second transistor Q2 comprises a gate electrode connected to the $(N-1)^{th}$ scan line Sn-1, a source electrode connected to the first power line VDDL via the contact hole, and a drain electrode connected to a second node N2 via the contact hole. The second transistor Q2 transmits voltage from the first power line VDDL to the first node N1 in response to the scan signal applied to the $(N-1)^{th}$ scan line Sn-1.

The third transistor Q3 comprises a gate electrode connected to the $(N-1)^{th}$ scan line Sn-1, a source electrode connected to the gate electrode of the driving transistor Q5, and a drain electrode connected to the second node N2 which is connected to an output terminal of the driving transistor Q5. The third transistor Q3 connects the gate electrode of the driving transistor Q5 to the second node N2 in response to the scan signal applied to the $(N-1)^{th}$ scan line Sn-1, thereby allowing the driving transistor Q5 to be used as a diode.

The storage capacitor Cst stores voltage corresponding to the data signal applied to the first node N1 via the first transistor Q1 while the scan signal is applied to the $N^{th}$ scan line Sn, and keeps the driving transistor Q5 turned on for one frame when the first transistor Q1 is turned off.

The compensation capacitor Cvth stores voltage corresponding to a threshold voltage of the driving transistor Q5 on the basis of voltage applied to the first power line VDDL while the scan signal is applied to the $(N-1)^{th}$ scan line Sn-1. That is, the compensation capacitor Cvth stores a compensation voltage for compensating the threshold voltage of the driving transistor Q5 while the second and third transistors Q2 and Q3, respectively, are turned on.

The driving transistor Q5 comprises a gate electrode connected to both the source electrode of the third transistor Q3 and the compensation capacitor Cvth, a source electrode connected to the first power line VDDL, and a drain electrode connected to a source electrode of the fourth transistor Q4. The driving transistor Q5 adjusts the current transmitted from the first power line VDDL and applied between the source and drain electrodes according to the voltage supplied to its gate electrode, and supplies the adjusted current to the fourth transistor Q4.

The fourth transistor Q4 comprises a gate electrode connected to the $(N-1)^{th}$ scan line Sn-1, a source electrode connected to the second node N2, and a drain electrode connected to the anode electrode of the OLED. The fourth transistor Q4 supplies a current from the driving transistor Q5 to the OLED in correspondence to the scan signal of a high level applied to the $(N-1)^{th}$ scan line Sn-1, thereby causing the OLED to emit light. Furthermore, the fourth transistor Q4 cuts off the current flowing between the driving transistor Q5 and the OLED while a scan signal of a low level is applied to the $(N-1)^{th}$ scan line Sn-1.

The OLED comprises an anode electrode connected to the drain electrode of the fourth transistor Q4, and a cathode electrode connected to a second power line (not shown). Furthermore, the OLED comprises an emitting layer, an electron transport layer, and a hole transport layer which are interposed between the anode electrode and the cathode electrode. Additionally, the OLED comprises an electron injection layer and a hole injection layer. In the OLED, when voltage is applied between the anode electrode and the cathode electrode, electrons generated by the cathode electrode are moved to the emitting layer via the electron injection layer and the electron transport layer, and holes generated by the anode electrode are moved to the emitting layer via the hole injection layer and the hole transport layer. Then, the electrons from the electron transport layer and the holes from the hole transport layer are recombined in the emitting layer, thereby emitting the light.

With this configuration, the light emitting display according to an embodiment of the present invention includes compensation capacitor Cvth, and second and third transistors Q2 and Q3, in order to compensate the threshold voltage Vth of the driving transistor Q5 even though pixels are different from each other in the threshold voltage Vth of the driving transistor Q5, so that the current applied to the OLED is kept constant, thereby maintaining the brightness of the pixels uniform regardless of their positions.

Referring to FIGS. 8 and 9, in each pixel of the light emitting display according to an embodiment of the present invention, the semiconductor layer 150 of the first transistor Q1, formed where a first metal layer 156 and a second metal layer 158 cross each other, has a line width greater than that of the second metal layer 158. Furthermore, in each pixel of the light emitting display according to an embodiment of the present invention, the first metal layer 156 is formed without a banding portion 159 at a region overlapping the semiconductor layer 150. That is, the first metal layer 156 has a uniform line width at the region overlapping the semiconductor layer 150.

Hereinbelow, a method of fabricating the transistor will be described with reference to FIGS. 10A through 10C, which are cross-sectional views of a transistor taken along line X-X' in FIG. 8 in a fabricating order.

Figure 10A:
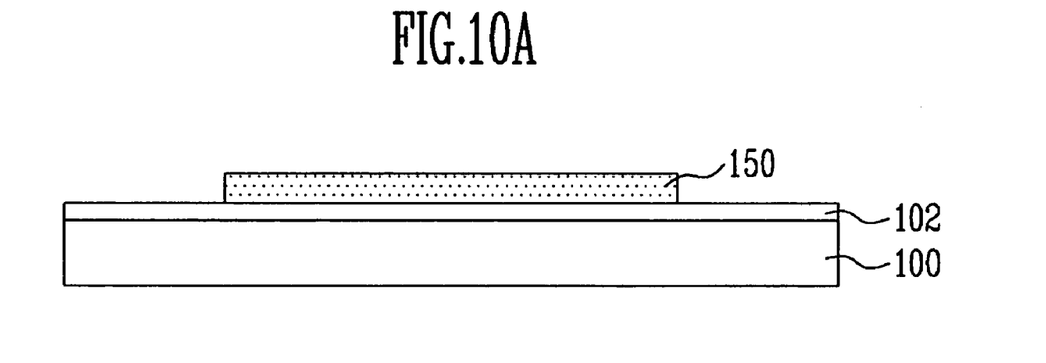
FIGS. 10A thru 10C are cross-sectional views of a transistor taken along line X-X' in FIG. 8 in a fabricating order.
Figure 10B:
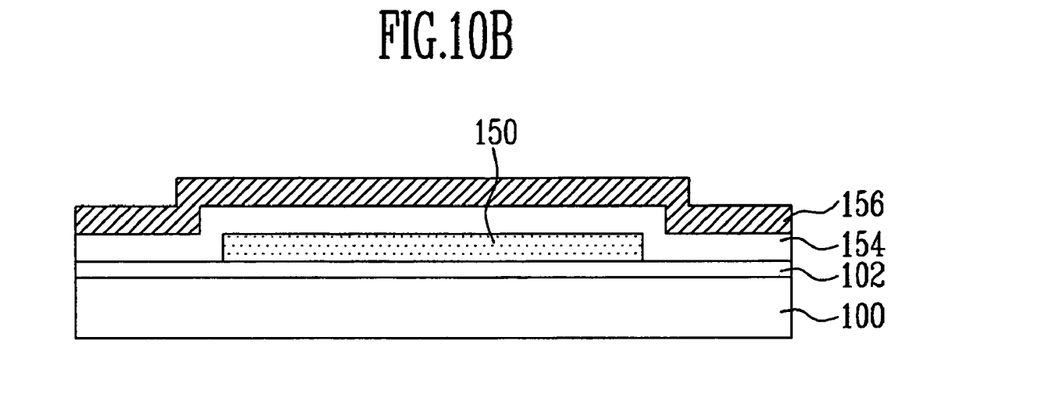

First, as shown in FIG. 10A, a first insulating layer such as buffer layer 102 is formed on a substrate 100. The buffer layer 102 is formed of silicon oxide ($SiO_2$), silicon nitride ($SiN_x$), or the like as a single layer. Alternatively, the buffer layer 102 may be formed as a double layer of silicon oxide ($SiO_2$)/ silicon nitride ($SiN_x$).

Then, amorphous silicon is deposited on the buffer layer 102, and is crystallized to form the semiconductor layer 150. A second insulating layer, such as gate insulating layer 154, is formed as shown in FIG. 10B. The gate-insulating layer 154 is formed of silicon oxide ($SiO_2$), silicon nitride ($SiN_x$), or the like as a single layer. Alternatively, the buffer layer 102 may be formed as a double layer of silicon oxide ($SiO_2$)/silicon nitride ($SiN_x$).

Then, a first metal layer, that is, gate metal layer 156, is deposited on the semiconductor layer 150. At this point, the gate metal layer 156 partially overlaps the semiconductor layer 150, and is connected to a line to which a scan signal turning on/off a thin film transistor is applied. Furthermore, the gate metal layer 156 has a uniform line width at a portion overlapping the semiconductor layer 150.

Then, the substrate 100 is doped with an ion so that source and drain regions of the semiconductor layer 150 are doped with the ion. Therefore, the semiconductor layer 150 is formed with a channel between the source and drain regions.

Figure 10C:
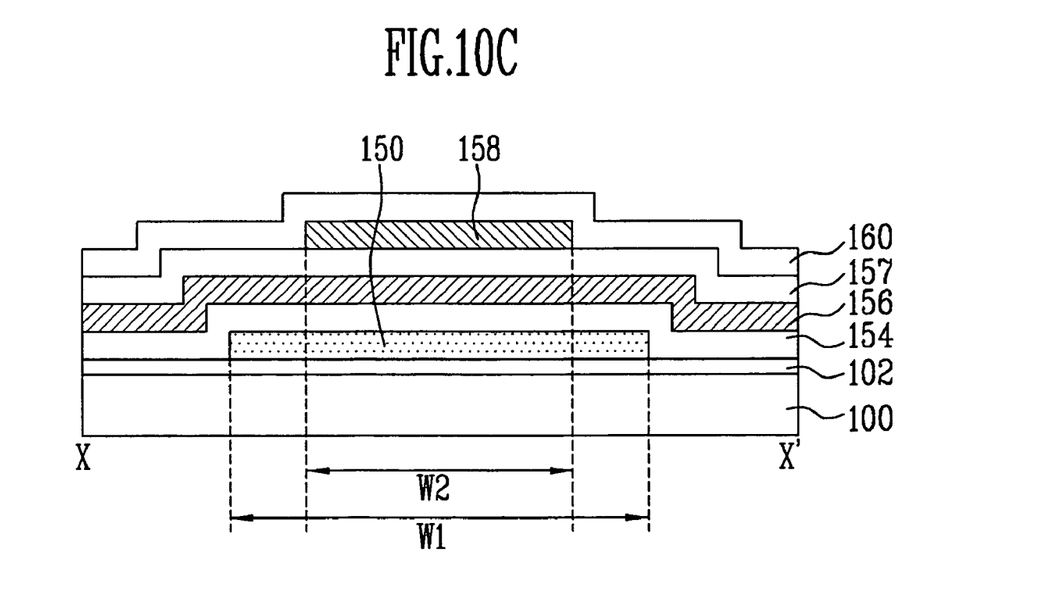

Then, as shown in FIG. 10C, a third insulating layer, such as interlaid insulating layer 157, is formed to cover the gate metal layer 156 on the substrate 100. Furthermore, a second metal layer, that is, a source/drain metal layer 158, is formed on the third insulating layer 157, and has a second width W2 narrower than the first width W1 of the semiconductor layer 150. At this point, the source/drain metal layer 158 overlaps the semiconductor layer 150 within the first width W1. A fourth insulating layer 160 is formed to cover the source/drain metal layer 158 on the substrate 100.

Thus, in the light emitting display according to an embodiment of the present invention, the semiconductor layer 150 has a first width W1 greater than the second width W2 of the source/drain metal layer 158 in a region where the gate metal layer 156 and the source/drain metal layer 158 cross each other, so that the source/drain metal layer 158 is disposed within the first width W1 of the semiconductor layer 150. Hence, a tip of the gate metal layer 156, due to a tip formed in a grain and a pattern edge of the semiconductor layer 150, is not disposed within the region overlapping the source/drain metal layer 158, so that generation of static electricity between the gate metal layer 156 and the source/drain metal layer 158 is prevented.

In the light emitting display according to an embodiment of the present invention, a pixel circuit for causing the OLED to emit light comprises at least two transistors and at least one capacitor. In the latter regard, the semiconductor layer of each transistor has a width greater than that of the source/drain metal layer, and the line width of the gate metal layer is uniformly formed in the region where the gate metal layer and the semiconductor layer overlap each other.

As described above, in the light emitting display according to an embodiment of the present invention, the semiconductor layer of the transistor formed in the region where the source/drain metal layer and the gate metal layer cross each other has a width greater than that of the source/drain metal layer so that the source/drain metal layer is disposed within the width of the semiconductor layer. Thus, according to an embodiment of the present invention, the tip of the gate metal layer, formed in the grain and the pattern edge of the semiconductor layer, is not disposed within the region overlapping the source/drain metal layer so that generation of static electricity between the gate metal layer and the source/drain metal layer is prevented.

Although preferred embodiments of the present invention have been shown and described, it should be appreciated by those skilled in the art that changes may be made to the disclosed embodiments without departing from the principles and spirit of the invention, the scope of which is defined in the claims and their equivalents.

What is claimed is:

1. A light emitting display, comprising
   at least one first metal layer;
   a second metal layer crossing said at least one first metal layer and having a first width;
   a light emitting device formed adjacent to a region where said at least one first metal layer and the second metal layer cross each other; and
   a pixel circuit comprising at least one transistor for causing the light emitting device to emit light, and a driving transistor connected between a power line formed from said at least one first metal layer and the light emitting device, and including a gate terminal;
   wherein said at least one transistor comprises a semiconductor layer having a second width greater than the first width; and
   wherein the pixel circuit further comprises:
   a first capacitor having a first terminal connected to a first node, and having a second terminal connected to the gate terminal of the driving transistor;
   a first transistor controlled by a first scan signal applied to a first scan line formed from said at least one first metal layer, and connected between a data line formed from the second metal layer and the first node;
   a second transistor controlled by a second scan signal applied to a second scan line formed from said at least one first metal layer, and connected between the first node and the power line;
   a third transistor controlled by the second scan signal, and connected between the gate terminal of the driving transistor and a second node connected to an output terminal of the driving transistor;
   a fourth transistor controlled by the second scan signal, and connected between the second node and an anode electrode of the light emitting device; and
   a second capacitor connected between the first node and the power line.

2. The light emitting display according to claim 1, wherein said at least one first metal layer has a width which is uniform in a region which overlaps the semiconductor layer.

3. The light emitting display according to claim 1, wherein said at least one transistor further comprises:
   a first insulating layer formed on the semiconductor layer;
   a gate metal layer formed on the first insulating layer;
   a second insulating layer formed on the gate metal layer; and
   a source/drain metal layer formed on the second insulating layer.

4. The light emitting display according to claim 3, wherein the gate metal layer is included in said at least one first metal layer.

5. The light emitting display according to claim 3, wherein the source/drain metal layer is included in the second metal layer.

6. The light emitting display according to claim 1, wherein the third transistor and the fourth transistor differ from each other in arrangements of N and P type materials.

7. The light emitting display of claim 1, said at least one transistor comprising:
   a gate metal layer made from the same material as said at least one first metal layer, said gate metal layer having a width which is uniform in a region overlapping the semiconductor layer; and
   a source/drain metal layer made from the same material as said second metal layer.

8. The light emitting display of claim 1, said at least one transistor comprising:
   a first insulating layer formed to cover the semiconductor layer;
   a gate metal layer formed on the first insulating layer and made from the same material as said at least one first metal layer, said gate metal layer having a width which is uniform in a region overlapping the semiconductor layer;
   a second insulating layer formed to cover the gate metal layer; and
   a source/drain metal layer formed on said second insulating layer and made from the same material as said second metal layer.

9. The light emitting display of claim 1, said semiconductor layer being formed at said region where said at least one first metal layer and the second metal layer cross each other, and having a uniform width across said region where said at least one first metal layer and the second metal layer cross each other, a banding portion being formed outside of said region where said at least one first metal layer and the second metal layer cross each other.

10. The light emitting display of claim 1, said semiconductor layer being formed at the region where said at least one first metal layer and said second metal layer cross each other;
   said semiconductor layer having a line width, across the region where said at least one first metal layer and said second metal layer cross each other, which is greater than the first width of said second metal layer; and
   said at least one first metal layer having a uniform width across the region where said at least one first metal layer and said second metal layer cross each other, a banding portion being formed outside of said region where said at least one first metal layer and said second metal layer cross each other.

11. A light emitting display, comprising:
   at least one first metal layer;
   a second metal layer crossing said at least one first metal layer and having a first width;
   a light emitting device formed adjacent to a region where said at least one first metal layer and the second metal layer cross each other;
   a pixel circuit comprising at least one transistor for causing the light emitting device to emit light, wherein said at least one transistor comprises a semiconductor layer having a second width greater than the first width; and
   a driving transistor connected between the second metal layer and the light emitting device, said at least one transistor and said driving transistor each comprising:
   a gate metal layer made from the same material as said first metal layer; and
   a source/drain metal layer made from the same material as said second metal layer;
   said gate metal layer of said at least one transistor having a width which is uniform in a region overlapping the semiconductor layer; and
   wherein the pixel circuit further comprises:
      a first capacitor having a first terminal connected to a first node, and having a second terminal connected to the gate terminal of the driving transistor;
      a first transistor controlled by a first scan signal applied to a first scan line formed from said at least one first metal layer, and connected between a data line formed from the second metal layer and the first node;
      a second transistor controlled by a second scan signal applied to a second scan line formed from said at least one first metal layer, and connected between the first node and the power line;
      a third transistor controlled by the second scan signal, and connected between the gate terminal of the driving transistor and a second node connected to an output terminal of the driving transistor;
      a fourth transistor controlled by the second scan signal, and connected between the second node and an anode electrode of the light emitting device; and
      a second capacitor connected between the first node and the power line.

* * * * *